United States Patent
Bayer et al.

[11] Patent Number: 5,576,357
[45] Date of Patent: Nov. 19, 1996

[54] ONE-COMPONENT REACTIVE RESIN SYSTEM COMPRISING A CURE-INHIBITING GLYCIDYL PHOSPHORUS COMPOUND

[75] Inventors: Heiner Bayer, Olching; Winfried Plundrich, Germering; Ernst Wipfelder, München, all of Germany

[73] Assignee: Siemens Aktiengesellschaft, Munich, Germany

[21] Appl. No.: 428,251

[22] PCT Filed: Oct. 27, 1993

[86] PCT No.: PCT/DE93/01024

§ 371 Date: May 3, 1995

§ 102(e) Date: May 3, 1995

[87] PCT Pub. No.: WO94/10223

PCT Pub. Date: May 11, 1994

[30] Foreign Application Priority Data

Nov. 3, 1992 [DE] Germany .......................... 42 37 132.5

[51] Int. Cl.$^6$ .......................... C08G 59/30; C08G 59/22; C08G 59/38; G03F 7/038
[52] U.S. Cl. .............................. 522/170; 522/171; 522/3; 522/25; 522/24; 528/108; 528/398; 264/211.24; 264/299; 264/478; 264/494
[58] Field of Search ........................ 264/22, 478, 211.24, 264/299; 522/170, 3, 171, 25, 24; 528/108, 398

[56] References Cited

U.S. PATENT DOCUMENTS

| 2,856,369 | 10/1958 | Smith et al. ............................. 528/398 |
| 4,336,302 | 6/1982 | Ihlein ..................................... 428/354 |
| 4,788,235 | 11/1988 | Johnson ................................. 523/451 |
| 4,868,288 | 9/1989 | Meier ..................................... 534/15 |
| 4,880,662 | 11/1989 | Habrich et al. ....................... 427/54.1 |
| 5,036,135 | 7/1991 | Von Gentzkow et al. ............. 524/786 |
| 5,458,978 | 10/1995 | Bottcher et al. ...................... 428/413 |

FOREIGN PATENT DOCUMENTS

| 0033295 | 8/1981 | European Pat. Off. . |
| 0094915 | 11/1983 | European Pat. Off. . |
| 0408990 | 1/1991 | European Pat. Off. . |
| 0412425 | 2/1991 | European Pat. Off. . |
| 61-046054 | 3/1986 | Japan . |

*Primary Examiner*—Frederick Krass
*Attorney, Agent, or Firm*—Hill, Steadman & Simpson

[57] ABSTRACT

A one-component reactive resin system which is stable in storage but nevertheless can readily be cured completely comprises a mixture of commercially available epoxy resins and phosphorus-containing glycidyl esters, in particular phosphonic acid diglycidyl esters, as well as cationic photoinitiators. The low-viscosity reactive resin systems cannot be cured purely by means of heat and can be processed at high temperatures and in particular can have a high filler content. The reactive resin systems, which are stable to storage even after UV activation, can be cured to flame-resistant molded materials under moderate conditions.

15 Claims, 1 Drawing Sheet

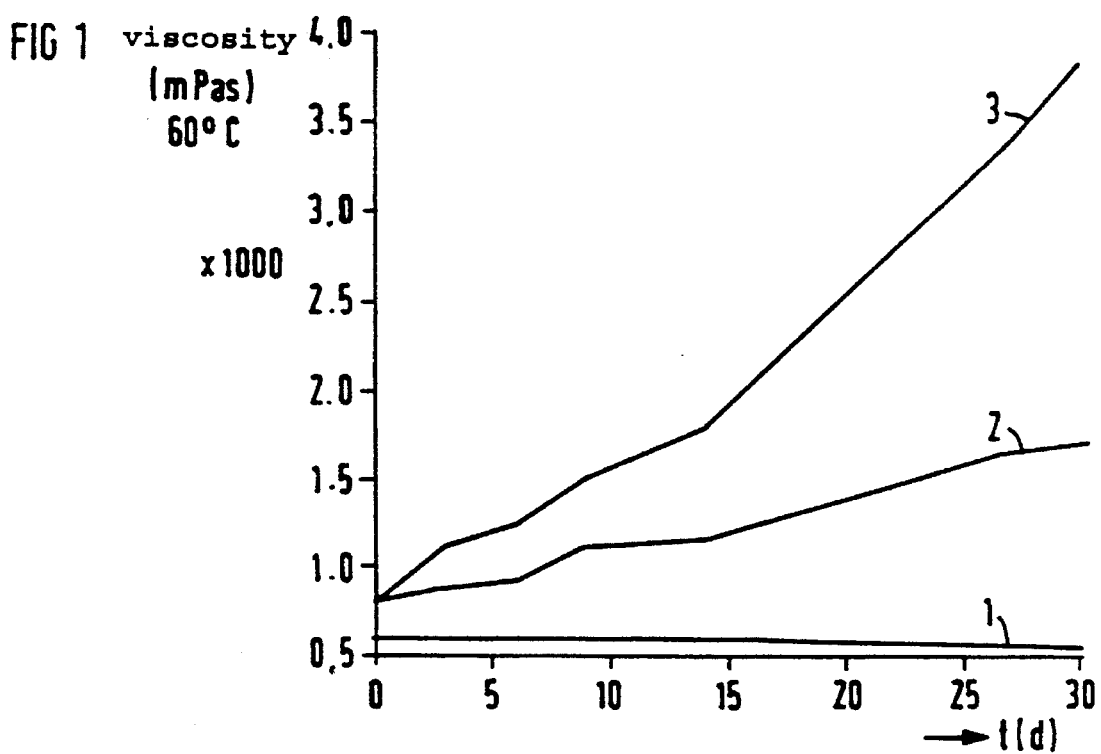
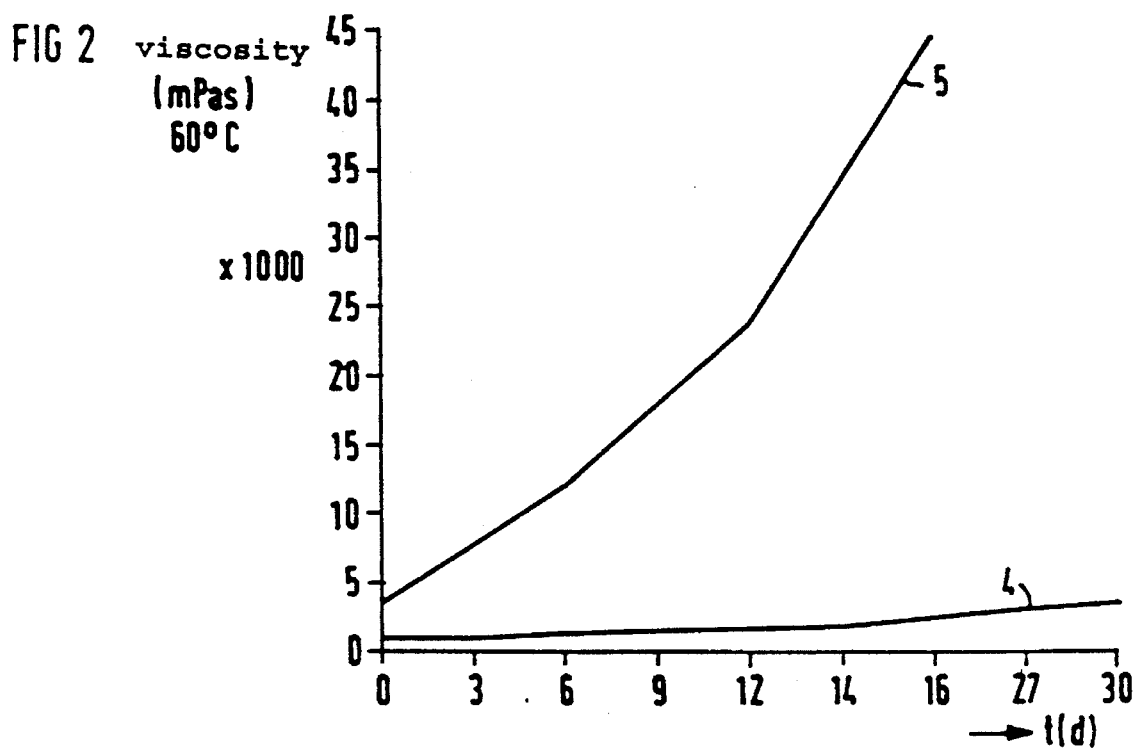

5,576,357

ONE-COMPONENT REACTIVE RESIN SYSTEM COMPRISING A CURE-INHIBITING GLYCIDYL PHOSPHORUS COMPOUND

BACKGROUND OF THE INVENTION

Flame-resistant reactive resin molded materials which can be processed reliably are required for covering and encapsulating electronic components. Casting technology is the customary form of application for passive components in particular. In addition, reaction injection molding is also used.

As a rule, resin and curing agent components are stored and handled separately from one another and are not combined until immediately before application and processed to give the ready-to-use reactive resin composition. The processing units required for this are cost-and maintenance-intensive, since the ready-to-use reactive resin composition cures completely relatively rapidly and thus has to be removed from the processing units at regular intervals.

Advantages during processing are achieved with one-component reactive resins which, because of the absence of premixing of the components, ensure a higher process reliability and therefore a reproducible quality if the one-component resins can be stored at room temperature for at least three months and if the curing conditions are moderate and compatible with the component to be embedded.

Customary one-component reactive resins are based on epoxy resins and dicyandiamide. They are as a rule employed as plastics. Such systems are unsuitable for casting resin uses because of the incompatibility of dicyandiamide in epoxy resins and the curing temperatures required (>150 C.).

EP-0 408 990 A3 discloses a reactive resin system which cures by means of heat and comprises a polyfunctional epoxide, a phosphorus compound containing epoxide groups, a polyfunctional isocyanate and a curing catalyst, and from which poorly combustible molded materials can be produced.

Another possibility of achieving lower curing temperatures is the storage of systems which are reactive per se at a reduced temperature. For example, ready-to-process and completely worked-up reactive resins are cooled at minus 25 C. and can be stored at this temperature for up to six months. However, this gives rise to considerable outlay on transportation and holding of stocks. Before use, these products must be heated up to the processing temperature with exclusion of moisture.

Reactive resins which can be cured by radiation are as a rule stable to storage. However, they are suitable only for uses in thin layers, which should not be shaded from the irradiation.

Another alternative is constituted by one-component reactive resins which cure completely by means of heat under cationic catalysis. Catalytic activation is effected by irradiation, a suitable photoinitiator dissociating into cations. Further complete curing is effected catalytically and is accelerated by increasing the temperature.

UV activation of such systems can be effected here after application, for example to a substrate, as is known, for example, from EP 0 094 915 A. However, a liquid reactive resin which is stable to storage for weeks is not said to be formed in this manner.

U.S. Pat. No. 4,880,662 proposes a device for activating suitable UV-activatable one-component systems by irradiation before application, so that the reactive resins are also suitable for shaded components, and in particular for embedding components.

SUMMARY OF THE INVENTION

The object of the present invention is to provide such one-component systems, and in particular to improve the flameproofing.

This object is achieved according to the invention by a one-component reactive resin system according to claim 1.

Further embodiments of the invention and uses according to the invention can be seen as follows.

Surprisingly, it has been found that mixtures of commercially available epoxy components and glycidyl esters of phosphonic acid, phosphinic acid and phosphoric acid to which customary cationic photoinitiators have been added give low-viscosity reactive resin compositions which cannot be cured purely by means of heat. This is surprising in as much as phosphorus compounds, for example phosphines and phosphonium salts, have hitherto been employed as accelerators in various resin systems. However, the reactive resin system according to the invention can be treated at temperatures of up to 150° C. without a curing reaction starting.

Even after activation of the reactive resin system with UV light, however, this remains liquid at room temperature for several months. This allows problem-free working in one unit. The application devices which come into direct contact with the activated reactive resin system, or even only storage and transportation tanks, can thus remain in operation for a correspondingly long time without intermediate cleaning being required, since no complete curing in the device is to be feared during this time.

On the other hand, the reactive resin system according to the invention can already be cured completely at moderate temperatures. Rapid thermal curing thus takes place, for example within less than one hour at 100° to 150° C. At low temperatures, correspondingly longer curing times are of course necessary.

The reactive resin system is therefore particularly suitable for casting technology. Because of the relatively low curing temperatures and the possible activation of the reactive resin system before application, it can also be applied in thick layers which can be thoroughly and completely cured with little stress.

The low viscosity which can be established in the reactive resin system furthermore allows a high content of filler to be added and a good processability nevertheless still to be obtained.

During complete curing, the reactive phosphorus component is incorporated into the reactive resin molded material and therefore shows no migration even when the reactive resin molded material is exposed to heat. The flame-resistant properties of the molded material due to the addition of phosphorus are therefore retained.

Although it is known that the addition of phosphorus-containing compounds to plastics, such as, for example, reactive resins, leads to flame-resistant properties, it has been found that phosphorus-containing compounds according to the invention impair catalytic curing of reactive resin systems. Even with additional added accelerator, such as imidazoles, the resins cure only slowly and incompletely, which leads to poor properties of the molded material. It has proven extremely difficult to find accelerators at all for phosphorus-containing reactive resin systems. The phosphorus compounds contained in the reactive resin system according to the invention thus mean that the system cannot be cured without a photoinitiator, but on the other hand with a photoinitiator can be cured rapidly and completely. An additional accelerator is not necessary.

A commercially available epoxy resin or a mixture of commercially available epoxy resins can be chosen as the epoxy resin (constituent A). Aromatic glycidyl ethers, for example those based on bisphenols or on novolaks, are preferred. Cycloaliphatic epoxides are also suitable. The content of constituent A in the entire system is about 30 to 90% by weight.

The reactive resin system according to the invention comprises the photoinitiator (constituent B) in an amount of about 0.1 to 5% by weight. Suitable proton-liberating photoinitiators for the UV-initiated cationic curing mechanism are derived, for example, from stable organic onium salts, in particular with nitrogen, phosphorus, oxygen, sulfur, selenium or iodine as the central atom of the cation. Aromatic sulfonium and iodonium salts with complex anions have proved to be particularly advantageous. A photoinitiator which liberates a Lewis acid and is realized, for example, as a pi-donor transition metal complex is also possible. Phenacylsulfonium salts, hydroxyphenylsulfonium salts and sulfoxonium salts may furthermore be mentioned. Onium salts which are excited to acid formation not directly but via a sensitizer can moreover be employed. Organosilicon compounds which liberate a silanol under UV irradiation in the presence of organoaluminum compounds can also initiate curing of the system according to the invention.

Organophosphorus compounds containing epoxide groups are suitable for constituent C; the reactive resin system will comprise the phosphorus compound in an amount of more than 5 percent by weight. Phosphorus-containing di- and triglycidyl esters are preferred. Two or three reactive glycidyl ester groups ensure better bonding of component B into the molded material, so that the stability and thermomechanical properties of the molded material are improved. If flameproofing properties are included in the profile of properties of the molded material, phosphonic acid diglycidyl ester with an aromatic radical R is preferred.

The phosphorus content of the (nonfilled) reactive resin system is adjusted to about 1 to 5% by weight. If a flameproofing action is emphasized, the highest possible phosphorus content is chosen, but should be weighed up against the sensitivity to hydrolysis, which increases with the phosphorus content. A lower phosphorus content leads to a shorter duration of use, since, according to the invention, the phosphorus compound increases storage stability. A phosphorus content of about 2 to 4% by weight is therefore preferred. The optimum phosphorus content in respect of storage stability also depends on the photoinitiator concentration and the irradiation time.

In addition to the epoxy component, other compounds which can be polymerized together with this can also be added to the reactive resin system to adjust the properties of the molded material. Cyclic ethers and cyclic esters are particularly suitable for this. Vinyl ethers and low molecular weight polyhydroxy compounds, such as polyether-polyols and polyester-polyols, are also suitable.

The reactive resin system can furthermore comprise additives customary for casting resins, for example adhesion promoters, flow auxiliaries, dyestuffs, thixotropic agents and, in particular, fillers. Additives which impair the activation can still be added even after the activation. An increased processing temperature of about 60° to 80° C. is possible, for example, for reducing the viscosity of a reactive resin system mixed with filler.

The reactive resin system according to the invention is not UV-curing but merely cures by means of heat with UV activation. The non-activated reactive resin system is completely inert under the influence of heat, and even after treatment at high temperatures (for example 1 h/150° C.) shows only an insignificant increase in viscosity. After the UV activation, the reactive resin system remains stable to storage for several months without losing its usability. It is possible to increase the temperature to 60° to 80° C. for application. Nevertheless, curing takes place completely at moderate temperatures (for example 100° to 150° C.) within a relatively short time (within 1 hour). These curing conditions are comparable to those of two-component reactive resin systems comprising resin and curing agent, but have the advantage over these of the one-component system which is stable to storage in a ready-to-use form and require no mixing of resin and curing agent immediately before application.

The UV activation can be carried out by continuous or discontinuous irradiation with a suitable light source either before or after the application, in the former case inside or outside the application device. The wavelength required for the activation depends on the photoinitiator chosen.

Suitable devices which allow continuous activation during the application are to be found in U.S. Pat. No. 4,880,662 and EP-0 279199 A2.

The invention is explained in more detail below with the aid of three compositions, given by way of example, of a reactive resin system according to the invention and with the aid of further studies and the associated two figures.

The figures show the storage stability, measured with the aid of the viscosity, of a reactive resin system according to the invention as a function of various parameters.

DESCRIPTION OF THE PREFERRED EMBODIMENTS

First embodiment example 20 parts by weight of bisphenol A diglycidyl ether (epoxide equivalent 0.5 mol/100 g), 7.3 parts by weight of phenylphosphonic acid diglycidyl ester and 0.27 part by weight of a 50% strength solution of the photoinitiatordiphenyl-4-thio-phenoxyphenylsulfoniumhexafluoroantimonate in propylene carbonate are mixed homogeneously. Without activation, this mixture can be stored at room temperature for more than one year.

For activation, the mixture is irradiated with a UV lamp having an output of 50 mW/cm$^2$ for one minute. The activated mixture can still be processed after storage at room temperature for more than 3 months, and can then be cured within one hour at 150° C. The resulting reactive resin molded material has a glass transition temperature of 82° C.

Second embodiment example 116 parts by weight of an epoxy-phenol novolak (epoxide equivalent 0.6 mol/100 g), 43 parts by weight of phenylphosphonic acid diglycidyl ester, 3.2 parts by weight of the photoinitiator from the first embodiment example and 40 parts by weight of an aluminum hydroxide filler (Apyral 4) are mixed homogeneously at 70° C. The reactive resin system which has been provided with the filler is finally exposed to UV irradiation for one minute.

After storage at room temperature for two weeks, the mixture is introduced into suitable casting molds and then cured at 110° C. for one hour and at 150° C. for two hours. Standard test bars are thus produced, and their properties are determined. The reactive resin molded material has a glass transition temperature of 124° C., and good chemical properties, such as a low absorption of water and high stability to hydrolysis, and passes the flameproof test in accordance with the standard of the Underwriters Laboratories UL 94 V0 up to a specimen thickness of 0.8 mm.

Third embodiment example 50 parts by weight of bisphenol A diglycidyl ether (epoxide equivalent 0.5 mol/100 g), 17.5 parts by weight of phenylphosphonic acid diglycidyl ester, 2.0 parts by weight of 2,4-cyclopentadien-1-yl-(1-methylethyl)-benzene-iron hexafluorophosphate, 1.7 parts by weight of cumene hydroperoxide and 0.25 part by weight of anthracene are mixed homogeneously at 60° C.

For activation, the reactive resin mixture is exposed to UV treatment for two minutes in a layer 2 mm thick. Even after storage at room temperature for six weeks, the activated reactive resin system remains processable. It can be cured to flame-retardant solid reactive resin molded materials after heat treatment.

For further characterization of the reactive resin systems, the curing properties are investigated as a function of the presence of various constituents and of the implementation of measures (exposure to UV light, heat treatment). The following table shows the result of varying the first embodiment example. The main epoxy component and the phosphorus-containing component remain unchanged in all the experiments. The phosphorus content is set at 3 percent. The photoinitiator is present—if at all—in an amount of one percent by weight, the exposure time to UV light is set at one minute and the curing time is set at one hour (at 150° C.). A nitrogen-containing epoxide is added in one case.

TABLE 1

| Epoxide addition N-containing | Filler (Apyral 4) | Photo-Initiator | Exposure to UV light | Heat Treatment | Curing Result |
|---|---|---|---|---|---|
| — | — | X | X | — | liquid |
| — | — | X | X | X | solid |
| — | X | X | X | X | solid |
| X | — | X | X | X | liquid |
| — | — | X | — | X | liquid |
| — | — | — | X | X | liquid |
| — | — | — | — | X | liquid |

As can be clearly seen from the results of the experiments, the photoinitiator is essential for the curing process. Even without UV activation or without heat treatment, the reactive resin system remains liquid. The curing process is not impaired by the addition of filler. On the other hand, no curing result according to the invention is achieved if the reactive resin system comprises nitrogen-containing compounds, for example N-containing epoxides or N-containing accelerators. It is also clear that no curing takes place by heat treatment without a photoinitiator.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows the viscosity properties of a reactive resin system corresponding to the first embodiment example under various conditions. The bottom curve 1 shows the viscosity properties of a reactive resin mixture comprising 3 percent of phosphorus and 1 percent of photoinitiator, which is not UV-activated and has been stored at room temperature. The viscosity of the reactive resin system remains unchanged over the observation period of 30 days. The increase in the viscosity of the same reactive resin system after activation with UV and storage at 5° C. is shown by curve 2. Here too, only an insignificant increase in viscosity is found after 30 days. The reactive resin system is still readily processable.

Curve 3 shows the viscosity properties of the activated mixture during storage at room temperature. Although the viscosity increases, it has only reached a value of about 3700 mPas, at which the casting resin can still easily be processed, after 30 days.

FIG. 2 shows the viscosity properties of a reactive resin system as a function of two different phosphorus contents. Curve 4 shows the properties of a reactive resin mixture having a phosphorus content of 3 percent, while the properties documented by curve 5 are determined on a reactive resin system which comprises 2 percent of phosphorus. It is clear that a higher phosphorus content increases the storage stability of the UV-activated reactive resin mixture at room temperature. However, even with a low phosphorus content, an activated reactive resin mixture can still be processed after 5 days. The duration of use is lengthened significantly if the photoinitiator concentration is decreased to 0.5 percent and the irradiation time is shortened.

The reactive resin system according to the invention is therefore most suitable for embedding any desired workpieces, in particular electronic components. The moderate curing conditions allow a relatively low-stress curing, while the high storage stability and the low viscosity facilitate automated processing and application of the reactive resin systems.

What is claimed is:

1. A one-component reactive resin system comprising:
   a phosphorus-free epoxy resin;
   a photoinitiator for a cationic curing process; and
   a phosphorus compound of the general formula

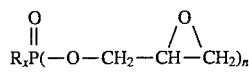

in which the radicals R independently of one another are an alkyl, aryl, hydroxyalkyl or alkyloxy radical, n=2 or 3 and x=(3−n) and wherein the reactive resin system comprises the phosphorus compound in an amount of more than 5 percent by weight, said reactive resin system exhibiting non-curing thermal stability prior to photoactivation at temperatures up to about 150° C. and after photoactivation exhibiting non-curing room temperature stability for a period of months and being thermally curable at temperatures of from about 100° C. to about 150° C.

2. The reactive resin system as claimed in claim 1, in which the photoinitiator is chosen from onium salts with nitrogen, phosphorus, oxygen, selenium, iodine or sulfur as the central atom of the cation.

3. The reactive resin system as claimed in claim 1, in which the photoinitiator is a complex salt with a transition metal as the cation.

4. The reactive resin system as claimed in claim 1, which additionally comprises a sensitizer for activation of an acid-forming initiator.

5. The reactive resin system as claimed in claim 1 which further comprises at least one additive selected from the group consisting of adhesion promoters, flow auxiliaries, dyestuffs, thixotropic agents and fibers.

6. The reactive resin system as claimed in claim 1, in which the phosphorus compound is a phosphorus compound with a hydroxy alkyl radical.

7. The reactive resin system as claimed in claim 1, in which the epoxy resin is selected from the group consisting of glycidyl ethers of bisphenols, glycidyl ethers of novolaks and cycloaliphatic epoxides.

8. The reactive resin system as claimed in claim 1 which has a phosphorus content of 1 to 5 percent by weight, so that flame-resistant molded materials are formed on curing.

9. A method for reaction injection molding comprising the steps of:

providing a reactive resin system comprising a phosphorus-free epoxy resin, a photoinitiator for a cationic curing process, and a phosphorus compound of the general formula

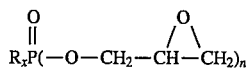

wherein R is selected from the group consisting of alkyl, aryl, hydroxyalkyl and alkyloxy radicals, wherein n=2 or 3 and x=(3−n); wherein said reactive resin system comprises the phosphorus compound in an amount of more than five percent by weight and exhibits non-curing thermal stability prior to photoactivation at temperatures up to about 150 degrees celsius and after photoactivation exhibits non-curing room temperature stability for a period of months while being thermally curable at temperatures of from about 100 degrees celsius to about 150 degrees celsius;

activating the reactive resin system with ultraviolet light;

injecting the reactive resin mixture into a mold; and curing the reactive resin mixture by heating.

10. The method for reaction injection molding according to claim 9 further comprising the steps of:

embedding an electrical component into the mold following the step of activating the reactive resin system with ultraviolet light;

covering the electrical component with the reactive resin mixture; and gluing the electrical component.

11. A reactive resin system as defined in claim 1, wherein said phosphorus compound is present in an amount sufficient to provide a phosphorus content of from about 2 to about 4% by weight, based on the weight of the reactive resin system.

12. A one-component reactive resin composition consisting essentially of:

(a) from about 30 to about 90% by weight of an epoxy resin selected from the group consisting of glycidyl ethers of bisphenols, glycidyl ethers of novolaks and cycloaliphatic epoxides, optionally including a co-polymerizable compound selected from the group consisting of cyclic ethers, cyclic esters, vinyl ethers, polyether polyols and polyester polyols;

(b) from about 0.1 to about 5% by weight of a photoinitiator for a cationic curing process, optionally including a sensitizer;

(c) greater than about 5% by weight of a di- or triglycidyl ester of phosphonic acid; and (d) optionally, an additive selected from the group consisting of adhesion promoters, flow auxiliaries, dyestuffs, thixotropic agents and fillers, said reactive resin system exhibiting non-curing thermal stability prior to photoactivation at temperatures up to about 150° C. and after photoactivation exhibiting non-curing room temperature stability for a period of months and being thermally curable at temperatures of from about 100° C. to about 150° C.

13. A one-component reactive resin composition as defined in claim 12, wherein the photoinitiator, component (b) is selected from the group consisting of aromatic sulfonium salt and aromatic iodonium salt photoinitiators.

14. A one-component reactive resin composition as defined in claim 12, wherein the photoinitiator, component (b), comprises 2,4-cyclopentadien-1-yl-(1-methylethyl)-benzene-iron hexafluorophosphate together with cumene hydroperoxide and anthracene.

15. A one-component reactive resin composition comprising:

an epoxy resin selected from the group consisting of glycidyl ethers of bisphenols, glycidyl ethers of novolaks and cycloaliphatic epoxides;

a cationic photoinitiator; and a thermal cure inhibiting amount of a di- or triglycidyl ester of phosphoric acid sufficient to prevent thermal curing of the composition prior to photoactivation of the composition up to a temperature of about 150° C. and after photoactivation of the composition providing non-curing room temperature stability for a period of months and permitting thermal curing at temperatures of from about 100° C. to about 150° C.

* * * * *